(12) United States Patent
Kitahara (10) Patent No.: US 9,700,961 B2
(45) Date of Patent: *Jul. 11, 2017

(54) ABLATION METHOD FOR DIE ATTACH FILM

(71) Applicant: Disco Corporation, Tokyo (JP)

(72) Inventor: Nobuyasu Kitahara, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 323 days.

This patent is subject to a terminal disclaimer.

(21) Appl. No.: 13/645,034

(22) Filed: Oct. 4, 2012

(65) Prior Publication Data

US 2013/0087949 A1    Apr. 11, 2013

(30) Foreign Application Priority Data

Oct. 6, 2011 (JP) ................... 2011-221724

(51) Int. Cl.
 *B23K 26/18* (2006.01)
 *H01L 21/78* (2006.01)
 (Continued)

(52) U.S. Cl.
 CPC ............ *B23K 26/18* (2013.01); *B23K 26/36* (2013.01); *B23K 26/40* (2013.01); *H01L 21/3065* (2013.01); *H01L 21/6836* (2013.01); *H01L 21/78* (2013.01); *B23K 2203/172* (2015.10); *H01L 21/67092* (2013.01); *H01L 24/27* (2013.01); *H01L 24/29* (2013.01); *H01L 2221/68377* (2013.01);
 (Continued)

(58) Field of Classification Search
 CPC ............ H02L 21/78; B23K 26/00; B38D 5/04

USPC ......... 438/113, 460, 195; 264/400, 157, 160
See application file for complete search history.

(56) References Cited

U.S. PATENT DOCUMENTS 7,179,723 B2 *  2/2007  Genda et al. ................. 438/462
7,541,213 B2     6/2009  Akimoto
(Continued)

FOREIGN PATENT DOCUMENTS

JP    10-305420    11/1998
JP    2002-118081   4/2002
(Continued)

OTHER PUBLICATIONS

Nonfinal office action issued in U.S. Appl. No. 14/151,071 dated Feb. 25, 2015.
(Continued)

*Primary Examiner* — Jeffrey Wollschlager
*Assistant Examiner* — Armand Melendez
(74) *Attorney, Agent, or Firm* — Greer Burns & Crain, Ltd.

(57) ABSTRACT

An ablation method of applying a laser beam to a die attach film to perform ablation. The ablation method includes a protective film forming step of applying a liquid resin containing a fine powder of oxide having absorptivity to the wavelength of the laser beam to at least a subject area of the die attach film to be ablated, thereby forming a protective film containing the fine powder on at least the subject area of the die attach film, and a laser processing step of applying the laser beam to the subject area coated with the protective film, thereby performing ablation through the protective film to the subject area of the die attach film after performing the protective film forming step.

8 Claims, 9 Drawing Sheets

(51) Int. Cl.

| | | |
|---|---|---|
| *H01L 21/3065* | (2006.01) | |
| *B23K 26/36* | (2014.01) | |
| *H01L 21/683* | (2006.01) | |
| *B23K 26/40* | (2014.01) | |
| *H01L 21/67* | (2006.01) | |
| *H01L 23/00* | (2006.01) | |
| *B23K 103/16* | (2006.01) | |

(52) U.S. Cl.
CPC ............ *H01L 2224/27436* (2013.01); *H01L 2224/2919* (2013.01); *H01L 2224/83191* (2013.01); *H01L 2224/94* (2013.01); *H01L 2924/12042* (2013.01)

(56) References Cited

U.S. PATENT DOCUMENTS

| | | | | |
|---|---|---|---|---|
| 7,622,366 | B2* | 11/2009 | Nakamura | B23K 26/009 438/463 |
| 2003/0143819 | A1* | 7/2003 | Hedler | H01L 21/78 438/462 |
| 2004/0266138 | A1* | 12/2004 | Kajiyama | H01L 21/6835 438/462 |
| 2006/0105544 | A1 | 5/2006 | Takanashi et al. | |
| 2007/0221321 | A1 | 9/2007 | Bohm | |
| 2008/0108229 | A1 | 5/2008 | Tanaka | |
| 2009/0017599 | A1 | 1/2009 | Eguchi et al. | |
| 2009/0124063 | A1* | 5/2009 | Nakamura | B23K 26/009 438/463 |
| 2009/0280622 | A1* | 11/2009 | Genda et al. | 438/462 |
| 2010/0120228 | A1 | 5/2010 | Saito et al. | |
| 2010/0248451 | A1 | 9/2010 | Pirogovsky et al. | |
| 2010/0304551 | A1 | 12/2010 | Takanashi et al. | |
| 2011/0089609 | A1* | 4/2011 | Landry-Coltrain et al. | 264/400 |
| 2012/0080786 | A1* | 4/2012 | Furutani | H01L 21/568 257/737 |
| 2013/0087948 | A1* | 4/2013 | Kitahara | 264/400 |
| 2013/0087949 | A1 | 4/2013 | Kitahara | |
| 2014/0175070 | A1* | 6/2014 | Ohura et al. | 219/121.69 |
| 2014/0206177 | A1* | 7/2014 | Ogawa et al. | 438/462 |

FOREIGN PATENT DOCUMENTS

| | | |
|---|---|---|
| JP | 2004-188475 | 7/2004 |
| JP | 2004-330236 A | 11/2004 |
| JP | 2005-142398 | 6/2005 |
| JP | 2005-150523 | 6/2005 |
| JP | 2005-353935 | 12/2005 |
| JP | 2005-353935 A | 12/2005 |
| JP | 2006-140311 | 6/2006 |
| JP | 2007-118011 | 5/2007 |
| JP | 2009-231632 | 10/2009 |
| JP | 2010-194757 | 9/2010 |
| JP | 2010-207723 A | 9/2010 |
| JP | 2011-176340 | 9/2011 |

OTHER PUBLICATIONS

U.S. Appl. No. 14/102,892, filed Dec. 11, 2013.
U.S. Appl. No. 13/644,988, filed Oct. 4, 2012.
Taleb et al.; "Study of Spinning Speed, Multiplayer Coating and Formaldehyde effect on Preparation of Xerogel Film Doped with Laser Dyes"; African Physical Review (2009) 3; pp. 117-118.

* cited by examiner

ABLATION METHOD FOR DIE ATTACH FILM

BACKGROUND OF THE INVENTION

Field of the Invention

The present invention relates to an ablation method of applying a laser beam to a die attach film (DAF) to perform ablation.

Description of the Related Art

A plurality of devices such as ICs, LSIs, and LEDs are formed on the front side of a wafer such as a silicon wafer and a sapphire wafer so as to be partitioned by a plurality of division lines. The wafer is divided into the individual devices by any dividing apparatus such as a cutting apparatus and a laser processing apparatus. These devices are widely used in various electrical equipment such as mobile phones and personal computers. As a method of dividing the wafer into the individual devices, a dicing method using a cutting apparatus called a dicing saw is widely adopted. In this dicing method, a cutting blade having a thickness of about 30 μm is rotated at a high speed of about 30000 rpm and fed in the wafer to cut the wafer, thus dividing the wafer into the individual devices. The cutting blade is formed by bonding abrasive grains of diamond, for example, with metal or resin.

In recent years, it has been desired to further reduce the weight and size of electrical equipment such as mobile phones and personal computers, so that thinner devices have been required. As a technique of dividing a wafer into thinner devices, a so-called dicing before grinding process has been developed and put to practical use (see Japanese Patent Laid-open No. 2002-118081, for example). This dicing before grinding process includes the steps of forming a division groove having a predetermined depth (corresponding to the finished thickness of each device) along each street (division line) on the front side of a semiconductor wafer and next grinding the back side of the semiconductor wafer to expose each division groove to the back side of the semiconductor wafer, thereby dividing the semiconductor wafer into the individual devices. By this dicing before grinding process, the thickness of each device can be reduced to 100 μm or less.

Frequently adopted as a method of mounting to a lead frame the devices divided from each other by the dicing before grinding process is a method including the steps of attaching an adhesive film for die bonding called a die attach film (DAF) to the back side of each device and mounting each device through the DAF to the lead frame. In this mounting method, the following technique has been studied. A protective tape is previously attached to the front side of the wafer divided into the individual devices by the dicing before grinding process, so that the devices are united by the protective tape. Accordingly, the DAF is attached to the back side of the wafer divided into the individual devices, and the DAF is next attached to an adhesive tape supported to an annular frame. Thereafter, the protective tape is peeled off from the front side of the wafer.

Thereafter, the wafer with the DAF supported to the annular frame is held under suction on a chuck table of a laser processing apparatus, and a laser beam is applied to the DAF through division grooves formed in the wafer, thereby dividing the DAF into parts respectively corresponding to the individual devices.

SUMMARY OF THE INVENTION

According to this technique, the DAF (die attach film) is attached to the back side of the wafer divided into the individual devices, and the laser beam is applied to the DAF along the division grooves to thereby divide the DAF into parts respectively corresponding to the individual devices. However, this technique has a problem such that the energy of the laser beam may not be sufficiently transmitted to the DAF, so that the DAF cannot be reliably divided.

It is therefore an object of the present invention to provide an ablation method which can reliably divide the DAF into parts respectively corresponding to the individual devices.

In accordance with an aspect of the present invention, there is provided an ablation method of applying a laser beam to a die attach film to perform ablation, the ablation method including a protective film forming step of applying a liquid resin containing a fine powder of oxide having absorptivity to the wavelength of the laser beam to at least a subject area of the die attach film to be ablated, thereby forming a protective film containing the fine powder on at least the subject area of the die attach film; and a laser processing step of applying the laser beam to the subject area coated with the protective film, thereby performing ablation through the protective film to the subject area of the die attach film after performing the protective film forming step.

Preferably, the fine powder of the oxide has an average particle size smaller than the spot diameter of the laser beam. Preferably, the wavelength of the laser beam is 355 nm or less; the fine powder of the oxide includes a metal oxide selected from the group consisting of $Fe_2O_3$, $ZnO$, $TiO_2$, $CeO_2$, $CuO$, $Cu_2O$, and $MgO$; and the liquid resin includes polyvinyl alcohol.

According to the ablation method of the present invention, the liquid resin containing the fine powder of oxide having absorptivity to the wavelength of the laser beam is first applied to at least the subject area of the die attach film to be ablated, thereby forming the protective film containing the fine powder of oxide. Thereafter, the ablation is performed through the protective film to the subject area of the die attach film. Accordingly, the energy of the laser beam is absorbed by the fine powder of oxide contained in the protective film to reach a bandgap energy and break the atomic bond, thereby causing chained ablation to the die attach film. As a result, the die attach film can be reliably divided into parts respectively corresponding to the devices.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
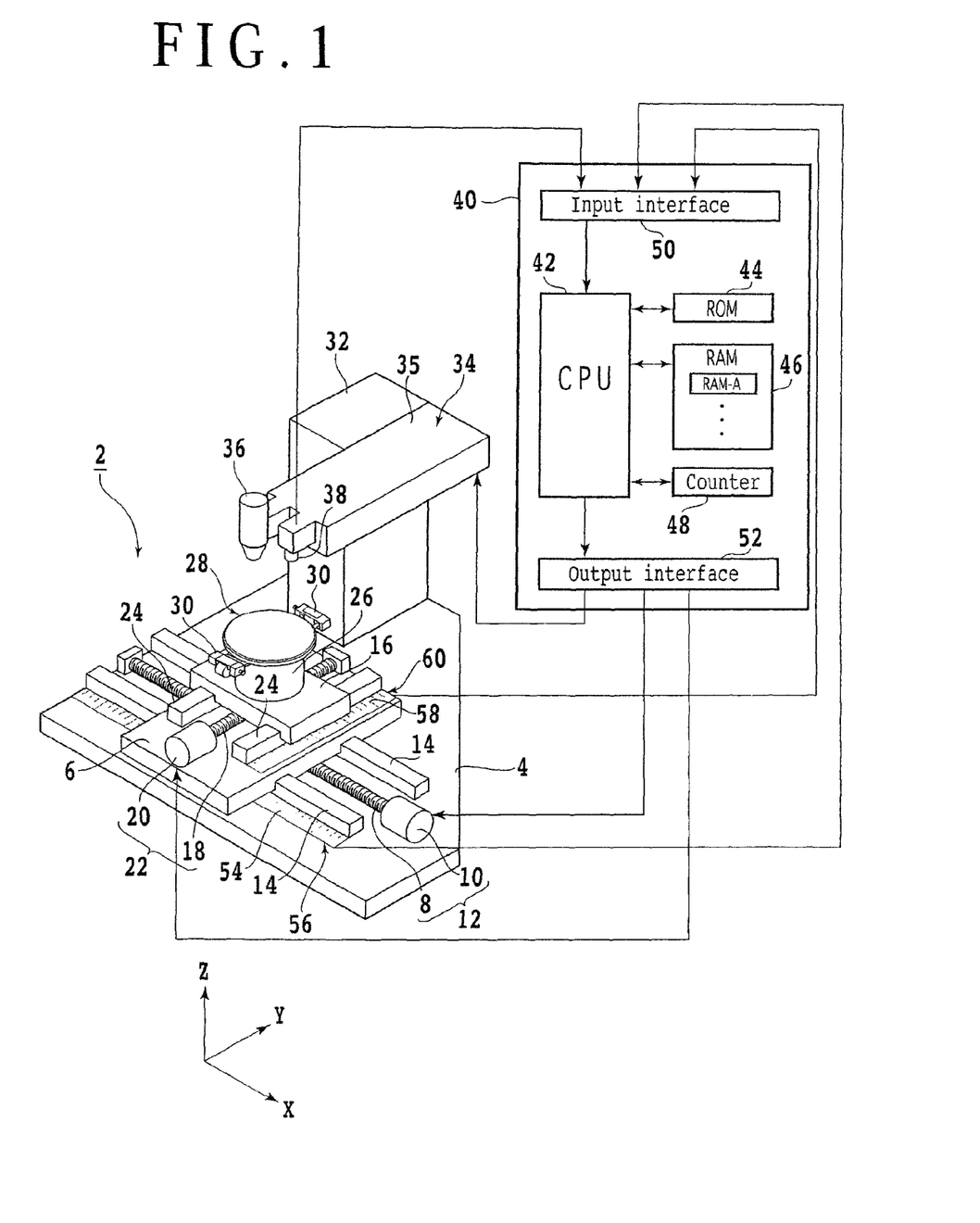
FIG. 1 is a schematic perspective view of a laser processing apparatus for performing the ablation method according to the present invention.

Preferred embodiments of the present invention will now be described in detail with reference to the drawings. FIG. 1 is a schematic perspective view of a laser processing apparatus 2 for performing the ablation method according to the present invention for ablating a die attach film (DAF). The laser processing apparatus 2 includes a stationary base 4 and a first slide block 6 supported to the stationary base 4 so as to be movable in the X direction shown by an arrow X. The first slide block 6 is movable in a feeding direction, i.e., in the X direction along a pair of guide rails 14 by feeding means 12 including a ball screw 8 and a pulse motor 10.

A second slide block 16 is supported to the first slide block 6 so as to be movable in the Y direction shown by an arrow Y. The second slide block 16 is movable in an indexing direction, i.e., in the Y direction along a pair of guide rails 24 by indexing means 22 including a ball screw 18 and a pulse motor 20. A chuck table 28 is supported through a cylindrical support member 26 to the second slide block 16. Accordingly, the chuck table 28 is movable both in the X direction and in the Y direction by the feeding means 12 and the indexing means 22. The chuck table 28 is provided with a pair of clamps 30 for clamping a semiconductor wafer W (see FIG. 2) held on the chuck table 28 under suction.

Figure 2:
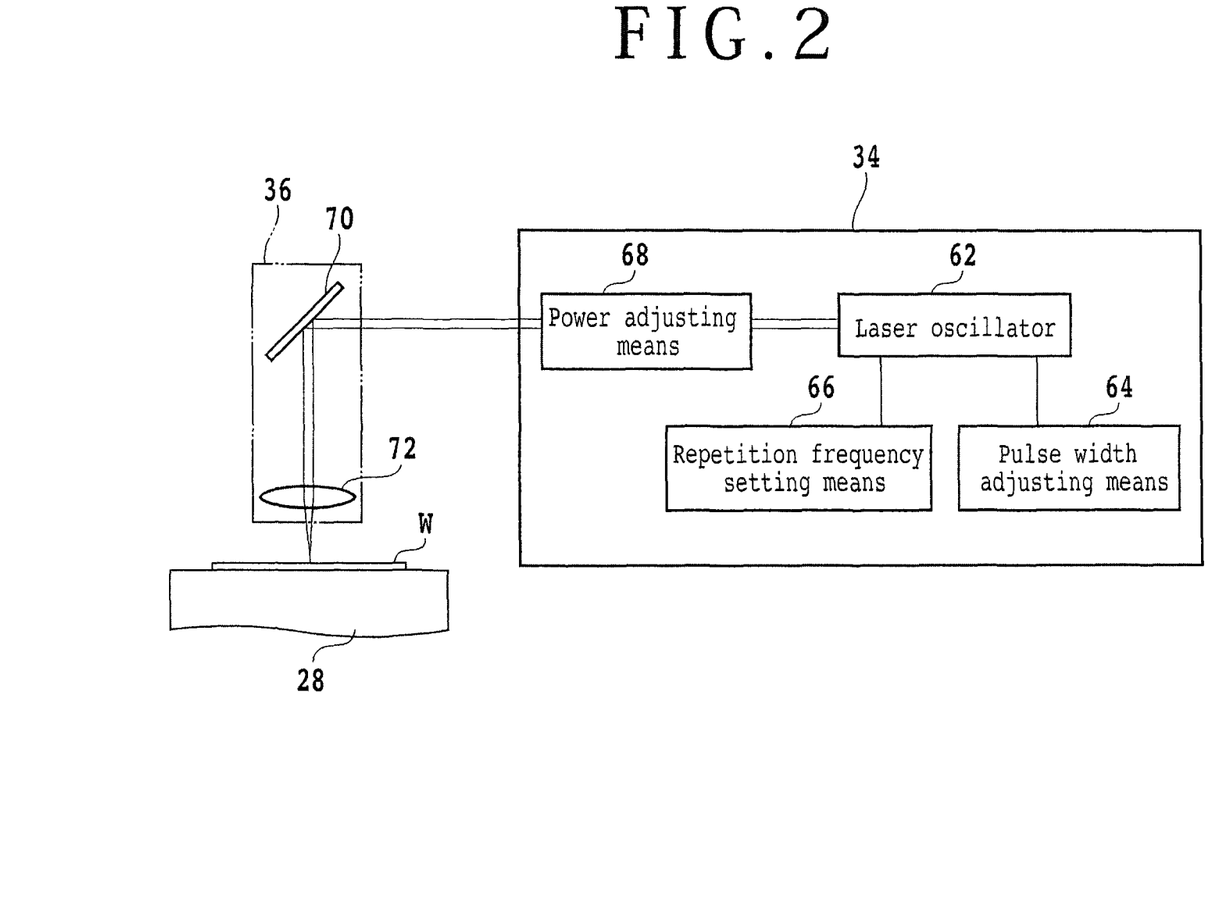
FIG. 2 is a block diagram of a laser beam applying unit.

A column 32 is provided on the stationary base 4, and a casing 35 for accommodating a laser beam applying unit 34 is mounted on the column 32. As shown in FIG. 2, the laser beam applying unit 34 includes a laser oscillator 62 such as a YAG laser oscillator or a YVO4 laser oscillator, repetition frequency setting means 64, pulse width adjusting means 66, and power adjusting means 68. A pulsed laser beam is generated by the laser oscillator 62, and the power of the pulsed laser beam is adjusted by the power adjusting means 68. Focusing means 36 is mounted at the front end of the casing 35 and includes a mirror 70 and a focusing objective lens 72. The pulsed laser beam from the laser beam applying unit 34 is reflected by the mirror 70 and next focused by the objective lens 72 in the focusing means 36 so as to form a laser beam spot on the front side of the semiconductor wafer W held on the chuck table 28.

Referring back to FIG. 1, an imaging unit 38 for detecting a subject area of the semiconductor wafer W to be laser-processed is also provided at the front end of the casing 35 so as to be juxtaposed to the focusing means 36 in the X direction. The imaging unit 38 includes an ordinary imaging device such as a CCD for imaging the subject area of the semiconductor wafer W by using visible light. The imaging unit 38 further includes an infrared imaging unit composed of infrared light applying means for applying infrared light to the semiconductor wafer W, an optical system for capturing the infrared light applied to the semiconductor wafer W by the infrared light applying means, and an infrared imaging device such as an infrared CCD for outputting an electrical signal corresponding to the infrared light captured by the optical system. An image signal output from the imaging unit 38 is transmitted to a controller (control means) 40.

The controller 40 is configured by a computer, and it includes a central processing unit (CPU) 42 for performing operational processing according to a control program, a read only memory (ROM) 44 preliminarily storing the control program, a readable and writable random access memory (RAM) 46 for storing the results of computation, etc., a counter 48, an input interface 50, and an output interface 52. Reference numeral 56 denotes feed amount detecting means including a linear scale 54 provided along one of the guide rails 14 and a read head (not shown) provided on the first slide block 6. A detection signal from the feed amount detecting means 56 is input into the input interface 50 of the controller 40.

Reference numeral 60 denotes index amount detecting means including a linear scale 58 provided along one of the guide rails 24 and a read head (not shown) provided on the second slide block 16. A detection signal from the index amount detecting means 60 is input into the input interface 50 of the controller 40. An image signal from the imaging unit 38 is also input into the input interface 50 of the controller 40. On the other hand, control signals are output from the output interface 52 of the controller 40 to the pulse motor 10, the pulse motor 20, and the laser beam applying unit 34.

Figure 3:
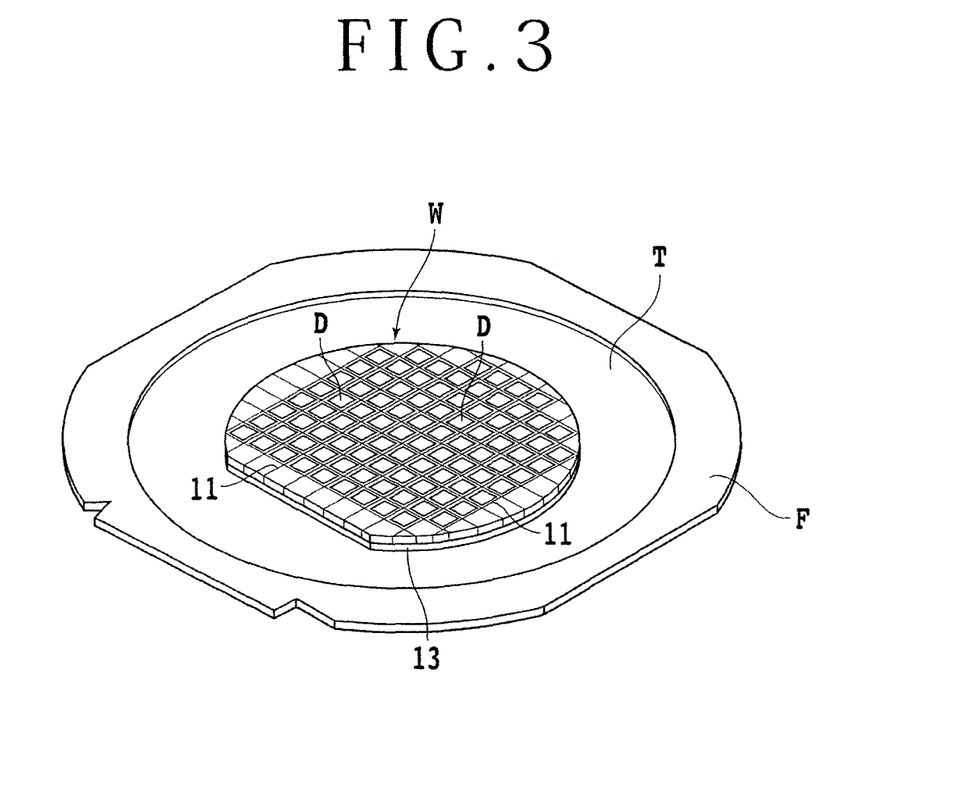
FIG. 3 is a perspective view of a semiconductor wafer with a DAF in the condition where the wafer is divided into individual devices and the wafer with the DAF is supported through an adhesive tape to an annular frame.
Figure 4:
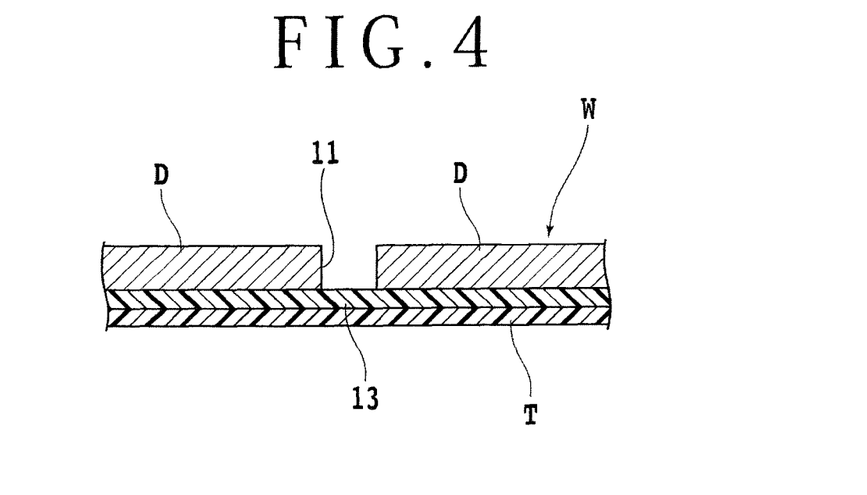
FIG. 4 is a sectional view of the wafer with the DAF in the condition shown in FIG. 3.

Referring to FIG. 3, there is shown a perspective view of a semiconductor wafer W with a DAF (die attach film) 13 attached to the back side thereof in the condition where the semiconductor wafer W is divided into individual devices D. The DAF 13 is a workpiece to be processed by the laser processing apparatus 2 shown in FIG. 1. The DAF 13 is composed of a base sheet and an adhesive layer formed on the base sheet. The base sheet is formed of epoxy resin, acrylic resin, synthetic rubber, or polyimide, for example. The adhesive layer is formed of acrylic adhesive or rubber adhesive, for example. As a preliminary step for the ablation method of this preferred embodiment, the DAF 13 is attached to the back side of the wafer W divided into the individual devices D by a dicing before grinding process, and the unit of the wafer W and the DAF 13 is next attached to an adhesive tape T supported to an annular frame F in the condition where the DAF 13 comes into contact with the adhesive tape T. Although not shown, a protective tape is next peeled off from the front side of the wafer W. This condition is shown in FIG. 3. In FIG. 3, reference numerals 11 denote a plurality of division grooves formed by the dicing before grinding process for separating the devices D from each other. Referring to FIG. 4, there is shown a sectional view of the wafer W with the DAF 13 in the condition shown in FIG. 3.

In the ablation method of this preferred embodiment, a liquid resin applying step is performed in such a manner that a liquid resin containing a fine powder of oxide having absorptivity to the wavelength of the laser beam is applied to the subject area of the DAF 13 to be ablated. For example, as shown in FIG. 5, a liquid resin 80 such as PVA (polyvinyl alcohol) containing a fine powder of oxide (e.g., $TiO_2$) having absorptivity to the wavelength (e.g., 355 nm) of the laser beam is stored in a liquid resin source 76.

A pump 78 is connected to the liquid resin source 76, and a nozzle 74 is connected to the pump 78. Accordingly, when the pump 78 is driven, the liquid resin 80 stored in the liquid resin source 76 is supplied from the nozzle 74 to the front side of the wafer W and then applied to the front side of the wafer W and also through the division grooves 11 to the front side (upper exposed surface) of the DAF 13. Thereafter, the liquid resin 80 applied to the front side of the wafer W and the front side of the DAF 13 is cured to form a protective film 82 containing the fine powder of oxide having absorptivity to the wavelength of the laser beam. This protective film 82 is formed also on the DAF 13 exposed to the division grooves 11. As a method of applying the liquid resin 80 to the front side of the wafer W and the front side of the DAF 13, spin coating may be adopted to apply the liquid resin 80 as rotating the wafer W. In this preferred embodiment, $TiO_2$ is adopted as the fine powder of oxide mixed in the liquid resin 80 such as PVA (polyvinyl alcohol) and PEG (polyethylene glycol).

Figure 5:
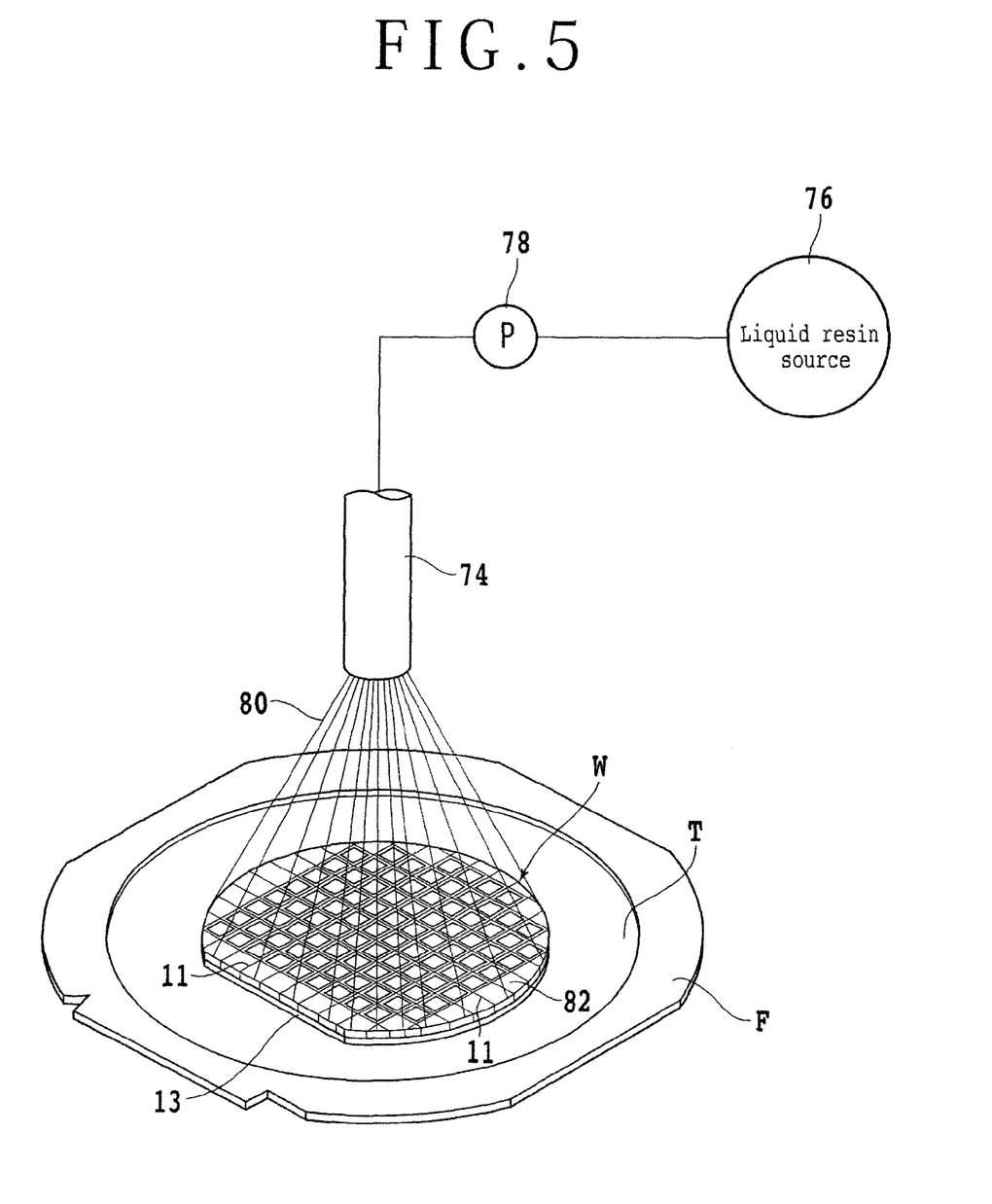
FIG. 5 is a perspective view showing a liquid resin applying step according to a first preferred embodiment of the present invention.

While the liquid resin 80 containing the fine powder of oxide is applied to the entire surface of the front side of the wafer W and the exposed surface of the DAF 13 to form the protective film 82 in this preferred embodiment shown in FIG. 5, the liquid resin 80 may be applied to only the subject area to be ablated, i.e., only the upper surface of the DAF 13 exposed to the division grooves 11. The average particle size of the fine powder of oxide mixed in the liquid resin 80 is preferably smaller than the spot diameter of the laser beam, more specifically smaller than 10 μm, for example.

Figure 6:
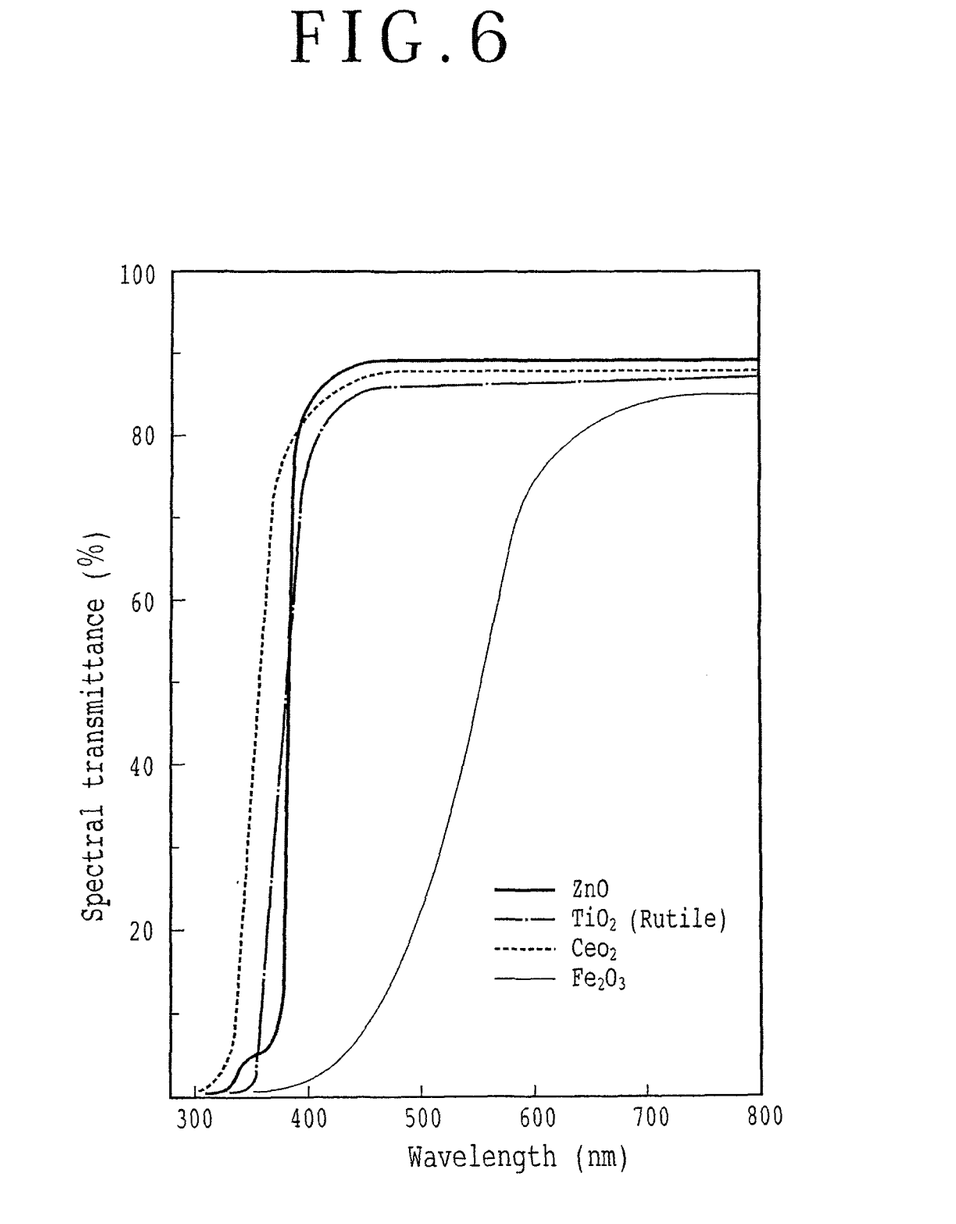
FIG. 6 is a graph showing the spectral transmittance of various metal oxides.

Referring to FIG. 6, there is shown the relation between spectral transmittance and wavelength for various metal oxides, i.e., ZnO, $TiO_2$, $CeO_2$, and $Fe_2O_3$. It can be understood from the graph shown in FIG. 6 that the laser beam to be used for ablation is almost absorbed by the fine powder of these metal oxides by setting the wavelength of the laser beam to 355 nm or less. As other metal oxides not shown in FIG. 6, CuO, $Cu_2O$, and MgO have a similar tendency on spectral transmittance. Accordingly, CuO, Cue, and MgO may also be adopted as the fine powder of oxide mixed in the liquid resin in the present invention. Thus, any one of $TiO_2$, $Fe_2O_3$, ZnO, $CeO_2$, CuO, $Cu_2O$, and MgO may be adopted as the fine powder of oxide mixed in the liquid resin in the present invention.

Table 1 shows the extinction coefficients k and melting points of these metal oxides. There is a relation of $\alpha=4\pi k/\lambda$ between extinction coefficient k and absorption coefficient $\alpha$, where $\lambda$ is the wavelength of light to be used.

TABLE 1

|  | Extinction coefficient k (@355 nm) | Melting point (° C.) |
| --- | --- | --- |
| ZnO | 0.38 | 1975 |
| $TiO_2$ | 0.2 | 1870 |
| $Fe_2O_3$ | 1< | 1566 |
| $CeO_2$ | 0.2 | 1950 |
| CuO | 1.5 | 1201 |
| $Cu_2O$ | 1.44 | 1235 |

Figure 7:
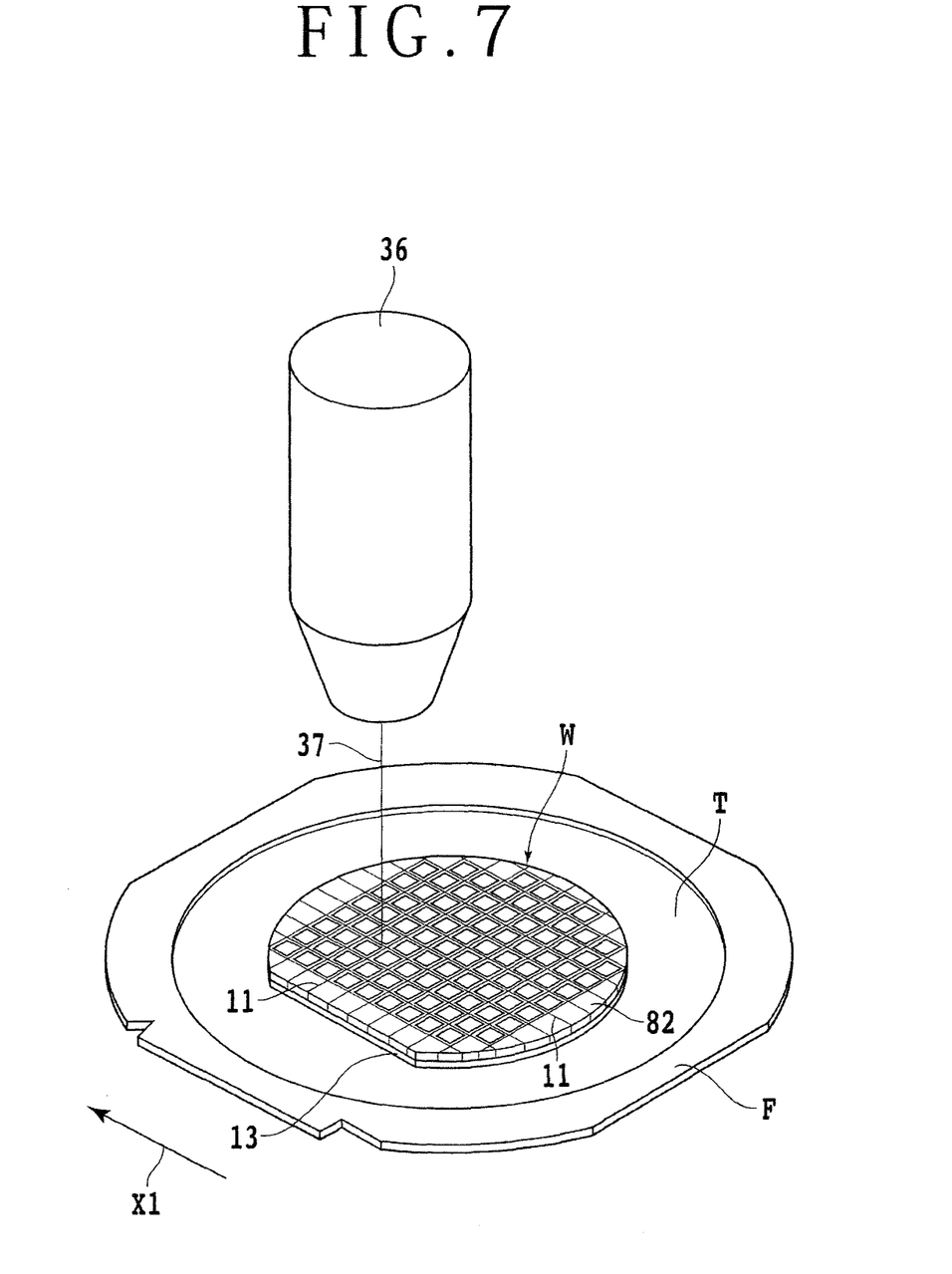
FIG. 7 is a perspective view showing a laser processing step by ablation for the DAF according to the first preferred embodiment.
Figure 8:
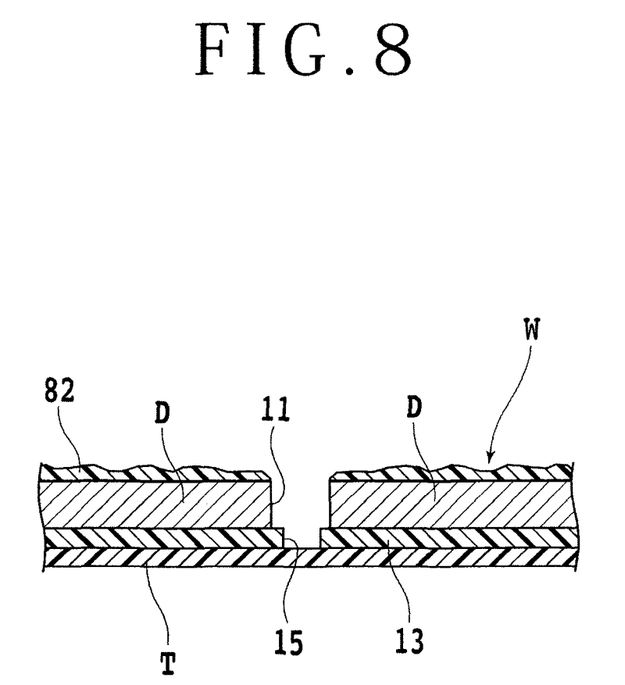
FIG. 8 is a sectional view of the wafer with the DAF shown in FIG. 7 in the condition where the DAF is divided along division grooves.

After performing the liquid resin applying step to form the protective film 82 on the front side of the wafer W and the front side of the DAF 13 exposed to the division grooves 11, a laser processing step by ablation is performed. This laser processing step is performed as shown in FIG. 7 in such a manner that a pulsed laser beam 37 having an absorption wavelength (e.g., 355 nm) to the fine powder of oxide contained in the protective film 82 is focused by the focusing means 36 and applied through a predetermined one of the division lines 11 extending in a first direction to the front side of the DAF 13 exposed thereto. At the same time, the chuck table 28 holding the semiconductor wafer W with the DAF 13 supported through the adhesive tape T to the annular frame F is moved at a predetermined feed speed in the direction shown by an arrow X1 in FIG. 7 to thereby form a laser processed groove 15 through the thickness of the DAF 13 along this predetermined division groove 11 by ablation as shown in FIG. 8.

Thereafter, the chuck table 28 holding the wafer W with the DAF 13 is indexed in the Y direction to similarly perform the ablation along all of the division grooves 11 extending in the first direction, thereby forming a plurality of laser processed grooves 15 in the DAF 13 along all of the division grooves 11 extending in the first direction. Thereafter, the chuck table 28 is rotated 90° to similarly perform the ablation along all of the division grooves 11 extending in a second direction perpendicular to the first direction, thereby forming a plurality of laser processed grooves 15 in the DAF 13 along all of the division grooves 11 extending in the second direction. Thus, the DAF 13 is divided by the laser processed grooves 15 into a plurality of parts respectively corresponding to the individual devices D.

Figure 9:
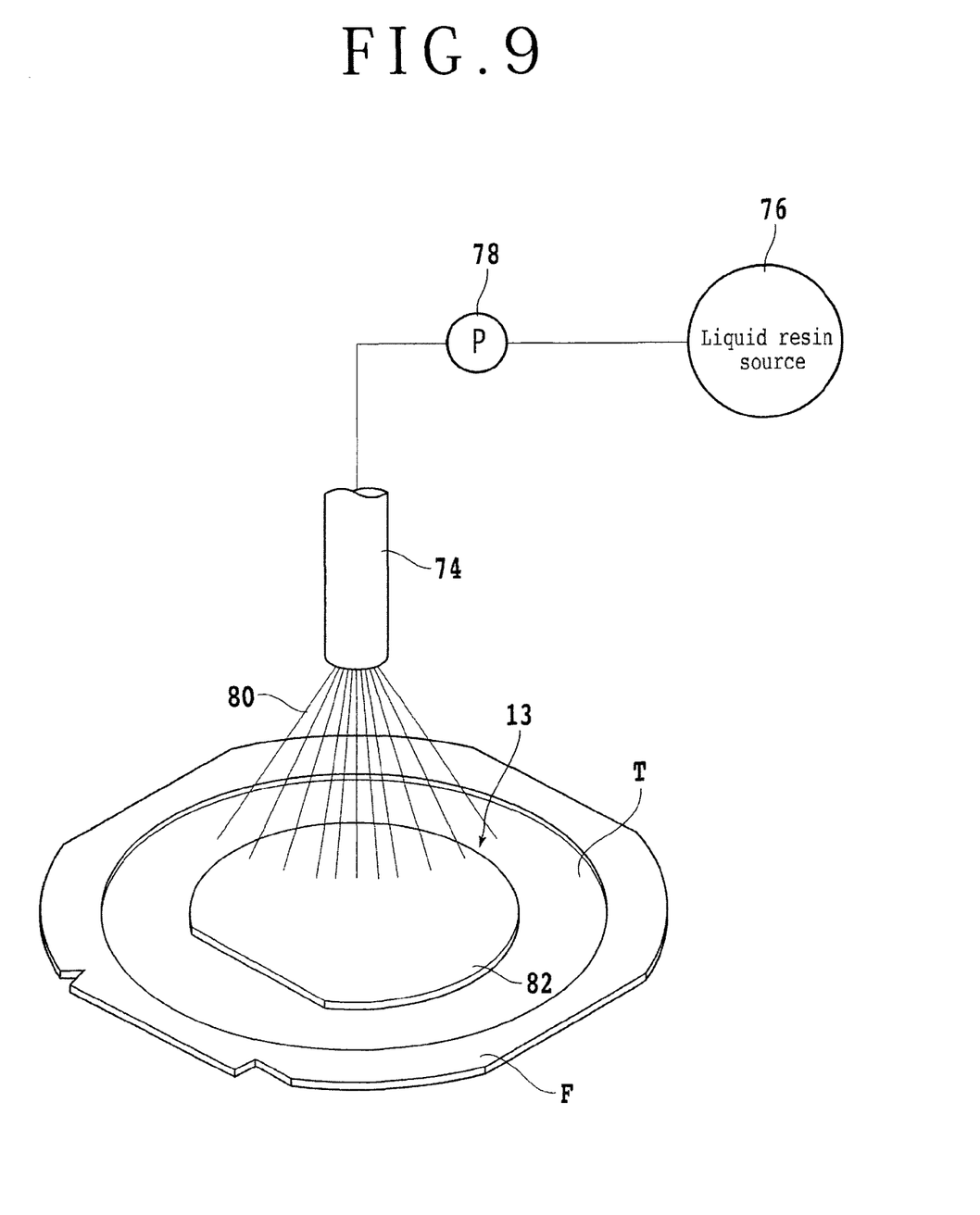
FIG. 9 is a perspective view showing a liquid resin applying step for the DAF according to a second preferred embodiment of the present invention.

This laser processing is performed under the following processing conditions, for example.
Light source: YAG pulsed laser
Wavelength: 355 nm (third harmonic generation of YAG laser)
Average power: 0.5 to 10 W
Repetition frequency: 10 to 200 kHz
Spot diameter: φ1 to 10 μm
Feed speed: 10 to 100 mm/sec A second preferred embodiment of the ablation method according to the present invention will now be described with reference to FIGS. 9 and 10. In this preferred embodiment, only the DAF 13 is attached to the adhesive tape T supported to the annular frame F. As similar to the first preferred embodiment mentioned above, the liquid resin 80 stored in the liquid resin source 76 is supplied from the nozzle 74 to the front side (exposed surface) of the DAF 13 and then applied thereto. Thereafter, the liquid resin 80 applied to the front side of the DAF 13 is cured to form the protective film 82 containing the fine powder of oxide having absorptivity to the wavelength of the laser beam.

Figure 10:
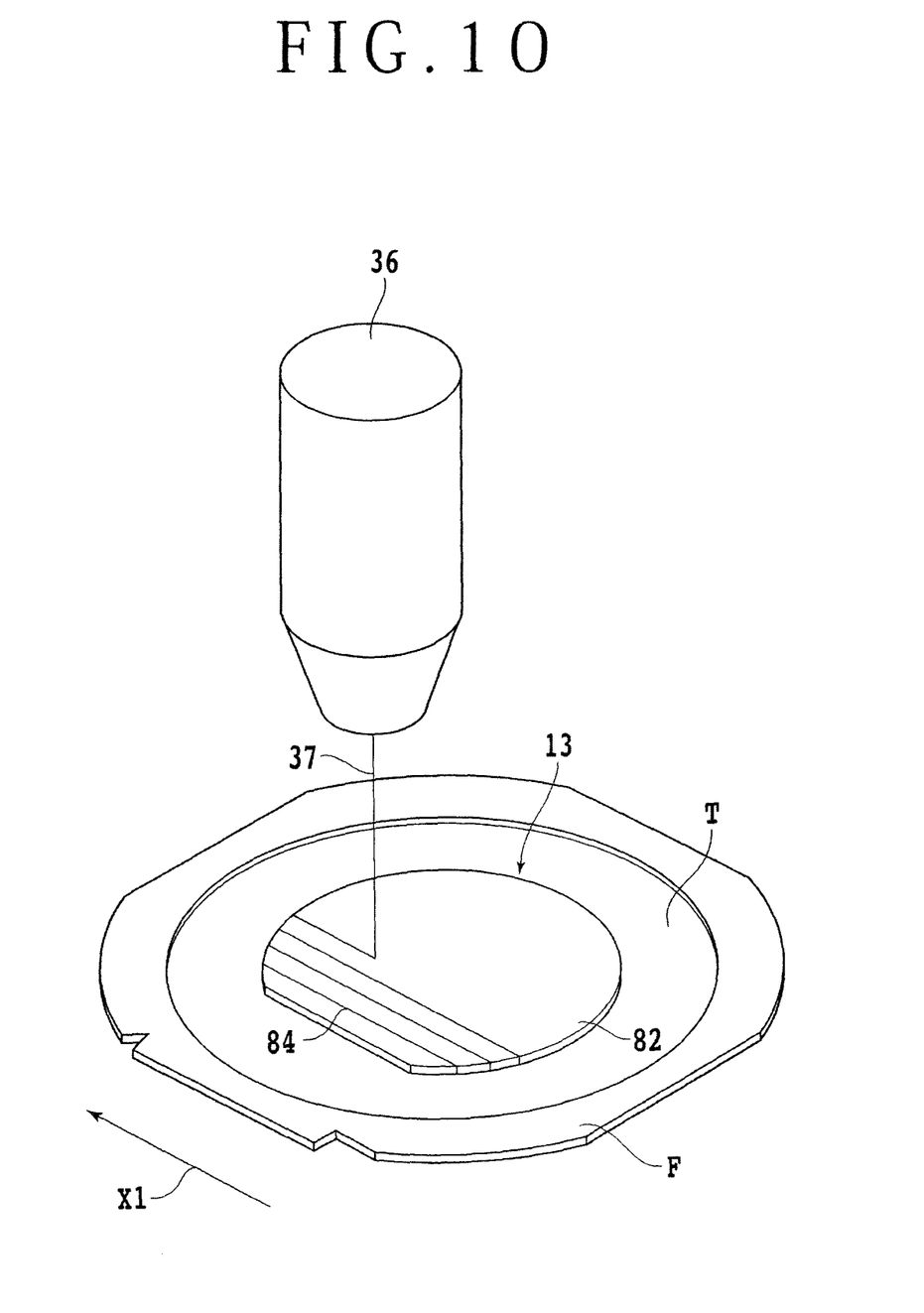
FIG. 10 is a perspective view showing a laser processing step by ablation for the DAF according to the second preferred embodiment.

After forming the protective film 82 on the front side of the DAF 13, the pulsed laser beam 37 having an absorption wavelength (e.g., 355 nm) to the fine powder of oxide contained in the protective film 82 is focused by the focusing means 36 and applied to the front side of the DAF 13 as shown in FIG. 10. At the same time, the chuck table 28 holding the DAF 13 supported through the adhesive tape T to the annular frame F is moved at a predetermined feed speed in the direction shown by an arrow X1 in FIG. 10 to thereby form a laser processed groove 84 through the thickness of the DAF 13 along a predetermined division line extending in a first direction by ablation. Thereafter, the chuck table 28 holding the DAF 13 is indexed in the Y direction stepwise by the pitch of the streets of the semiconductor wafer W, for example, thereby similarly forming a plurality of laser processed grooves 84 extending in the first direction. Thereafter, the chuck table 28 is rotated 90° to similarly form a plurality of laser processed grooves 84 extending in a second direction perpendicular to the first direction. Thus, the DAF 13 is divided by the laser processed grooves 84 into a plurality of parts respectively corresponding to the plural devices D of the semiconductor wafer W. Thereafter, the DAF 13 thus divided is attached to the back side of each device D.

According to the ablation methods of the first and second preferred embodiments mentioned above, the liquid resin 80 containing the fine powder of oxide having absorptivity to the wavelength of the laser beam is first applied to the front side of the DAF 13 to form the protective film 82. Thereafter, the ablation is performed through the protective film 82 to the DAF 13. Accordingly, the energy of the laser beam is absorbed by the fine powder of oxide contained in the protective film 82 to reach a bandgap energy and break the atomic bond, thereby causing chained ablation to the DAF 13. As a result, the DAF 13 can be reliably divided into parts respectively corresponding to the individual devices. The fine powder of oxide mixed in the liquid resin functions as a processing accelerator.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. An ablation method of applying a laser beam of a wavelength to a die attach film to perform ablation, said ablation method comprising:
    a division groove forming step of forming a plurality of division grooves in a semiconductor wafer using a dicing-before-grinding process to thereby separate a plurality of devices from each other;
    an application step of applying said die attach film to a back side of said semiconductor wafer, after said semiconductor wafer has been divided into said plurality of devices by said plurality of division grooves during said division groove forming step, wherein said division grooves extend through a depth of said semiconductor wafer from a front side of said semiconductor wafer to said die attach film on said back side of said semiconductor wafer;
    a protective film forming step of applying a liquid resin containing a powder of oxide having absorptivity to the wavelength of said laser beam from an area above said front side of said semiconductor wafer, thereby forming a protective film containing said powder on at least said die attach film exposed to said front side through said grooves, wherein said protective film forming step is performed after said application step of applying said die attach film; and
    a laser processing step of applying said laser beam through said grooves to said die attach film coated with said protective film, thereby performing ablation through said protective film to said die attach film after performing said protective film forming step,
    wherein during said laser processing step, the laser passes through one of the grooves formed during said division groove forming step, then through an associated portion of the protective film, and then through an associated portion of the die attach film, in order.

2. The ablation method according to claim 1, wherein said powder of said oxide is a fine powder that has an average particle size smaller than a spot diameter of said laser beam.

3. The ablation method according to claim 1, wherein:
    the wavelength of said laser beam is 355 nm or less;
    said powder of said oxide includes a metal oxide selected from the group consisting of $Fe_2O_3$, $ZnO$, $TiO_2$, $CeO_2$, $CuO$, $Cu_2O$, and $MgO$; and
    said liquid resin includes polyvinyl alcohol.

4. The ablation method according to claim 1, wherein said liquid resin is applied to only said plurality of grooves and the portions of the die attach film exposed by the grooves, without being applied to said front side of said semiconductor wafer.

5. The ablation method according to claim 1, wherein said powder is a fine powder with an average particle size of less than 10 μm.

6. The ablation method according to claim 1, wherein said liquid resin is applied to said plurality of grooves, the portions of the die attach film exposed by the grooves, and said front side of said semiconductor wafer.

7. The ablation method according to claim 1, wherein said laser processing step is performed by applying said laser beam from said front side of said semiconductor wafer.

8. The ablation method according to claim 1, further comprising a tape attaching step of attaching an adhesive tape supported by an annular frame to the die attach film such that the adhesive tape comes into contact with the die attach film, wherein said tape attaching step is performed before the laser processing step.

* * * * *